(12) United States Patent
Steuer et al.

(10) Patent No.: US 10,139,435 B2
(45) Date of Patent: Nov. 27, 2018

(54) NON-CONTACT VOLTAGE MEASUREMENT SYSTEM USING REFERENCE SIGNAL

(71) Applicant: Fluke Corporation, Everett, WA (US)

(72) Inventors: Ronald Steuer, Hinterbruhl (AT); Paul A. Ringsrud, Langley, WA (US); Jeffrey Worones, Seattle, WA (US); Peter Radda, Vitis (AT); Christian Karl Schmitzer, Brunn/Gebirge (AT)

(73) Assignee: Fluke Corporation, Everett, WA (US)

( * ) Notice: Subject to any disclaimer, the term of this patent is extended or adjusted under 35 U.S.C. 154(b) by 178 days.

(21) Appl. No.: 15/413,025

(22) Filed: Jan. 23, 2017

(65) Prior Publication Data
US 2018/0136264 A1    May 17, 2018

Related U.S. Application Data

(60) Provisional application No. 62/421,124, filed on Nov. 11, 2016.

(51) Int. Cl.
*G01R 19/18* (2006.01)
*G01R 19/257* (2006.01)
(Continued)

(52) U.S. Cl.
CPC .............. *G01R 19/257* (2013.01); *G01R 1/22* (2013.01); *G01R 15/14* (2013.01); *G01R 15/146* (2013.01);
(Continued)

(58) Field of Classification Search
CPC .............. G01R 19/257; G01R 19/2509; G01R 19/2503
See application file for complete search history.

(56) References Cited

U.S. PATENT DOCUMENTS

| 5,473,244 A | 12/1995 | Libove et al. |
| 5,583,444 A | 12/1996 | Nakamura et al. |

(Continued)

FOREIGN PATENT DOCUMENTS

| EP | 1 249 706 B1 | 9/2007 |
| JP | 6-28748 U | 4/1994 |

(Continued)

OTHER PUBLICATIONS

Hioki, "3258: Safety HiTESTER," Revised Edition 5, Hioki E. E. Corporation, Nagano Japan, 2 pages.
(Continued)

*Primary Examiner* — Tung X Nguyen
*Assistant Examiner* — Dominic Hawkins
(74) *Attorney, Agent, or Firm* — Seed Intellectual Property Law Group LLP

(57) ABSTRACT

Systems and methods for measuring alternating current (AC) voltage of an insulated conductor (e.g., insulated wire) are provided, without requiring a galvanic connection between the conductor and a test electrode or probe. A non-galvanic contact (or "non-contact") voltage measurement system includes a conductive sensor, an internal ground guard and a reference shield. A common mode reference voltage source is electrically coupled between the internal ground guard and the reference shield to generate an AC reference voltage which causes a reference current to pass through the conductive sensor. At least one processor receives a signal indicative of current flowing through the conductive sensor due to the AC reference voltage and the AC voltage in the insulated conductor, and determines the AC voltage in the insulated conductor based at least in part on the received signal.

29 Claims, 15 Drawing Sheets

(51) Int. Cl.
*G01R 19/25* (2006.01)
*G01R 1/22* (2006.01)
*G01R 15/14* (2006.01)
*G01R 19/00* (2006.01)

(52) U.S. Cl.
CPC ......... *G01R 19/00* (2013.01); *G01R 19/2503* (2013.01); *G01R 19/2509* (2013.01)

(56) References Cited

U.S. PATENT DOCUMENTS

| | | | |
|---|---|---|---|
| 5,973,501 | A | 10/1999 | Reichard |
| 6,014,027 | A | 1/2000 | Reichard |
| 6,043,640 | A | 3/2000 | Lauby et al. |
| 6,118,270 | A | 9/2000 | Singer et al. |
| 6,664,708 | B2 | 12/2003 | Shlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 9,651,584 | B2 * | 5/2017 | Gunn ................. G01R 19/0046 |
| 2002/0167303 | A1 | 11/2002 | Nakano |
| 2009/0058398 | A1 | 3/2009 | Ibuki |
| 2010/0060300 | A1 | 3/2010 | Müller et al. |
| 2010/0090682 | A1 | 4/2010 | Armstrong |
| 2010/0283539 | A1 | 11/2010 | Yanagisawa |
| 2012/0259565 | A1 | 10/2012 | Oshima et al. |
| 2013/0076343 | A1 | 3/2013 | Carpenter et al. |
| 2014/0035607 | A1 | 2/2014 | Heydron et al. |
| 2014/0062459 | A1 | 3/2014 | El-Essawy et al. |
| 2016/0109486 | A1 | 4/2016 | Yanagisawa |
| 2016/0187389 | A1* | 6/2016 | Kshirsagar ......... G01R 19/0053 324/76.11 |

FOREIGN PATENT DOCUMENTS

| | | |
|---|---|---|
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2014-106220 A | 6/2014 |
| JP | 2015-111087 A | 6/2015 |
| JP | 2016-3997 A | 1/2016 |

OTHER PUBLICATIONS

Mitchell Instrument Company Inc., clipping from the Mitchell Catalogue, undated, 1 page.

Takahashi, "Clamp On Power Logger PW3365 : Safety Voltage Sensor PW9020,"*Hioki Technical Notes* 1(1): 2015, 8 pages.

Tsang et al., "Dual capacitive sensors for non-contact AC voltage measurement," *Sensors and Actuators A 167*:261-266, 2011.

* cited by examiner

NON-CONTACT VOLTAGE MEASUREMENT SYSTEM USING REFERENCE SIGNAL

BACKGROUND

Technical Field

The present disclosure generally relates to measurement of electrical characteristics, and more particularly, to non-contact measurement of alternating current (AC) voltage.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least one measurement electrode or probe into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

A non-contact voltage detector is commonly used to detect the presence of alternating current (AC) voltage, typically high voltage, without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

Thus, there is a need for an AC voltage measurement system which provides convenient and accurate voltage measurements without requiring galvanic contact with the circuit being tested.

BRIEF SUMMARY

A system to measure alternating current (AC) voltage in an insulated conductor may be summarized as including a housing; a conductive sensor physically coupled to the housing, the conductive sensor selectively positionable proximate the insulated conductor without galvanically contacting the conductor, wherein the conductive sensor capacitively couples with the insulated conductor; a conductive internal ground guard which at least partially surrounds the conductive sensor and is galvanically isolated from the conductive sensor, the internal ground guard sized and dimensioned to shield the conductive sensor from stray currents; a conductive reference shield which surrounds at least a portion of the housing and is galvanically insulated from the internal ground guard, the conductive reference shield sized and dimensioned to reduce currents between the internal ground guard and an external ground; a common mode reference voltage source which, in operation, generates an alternating current (AC) reference voltage having a reference frequency, the common mode reference voltage source electrically coupled between the internal ground guard and the conductive reference shield; a current measurement subsystem electrically coupled to the conductive sensor, wherein the current measurement subsystem, in operation, generates a sensor current signal indicative of current conducted through the conductive sensor; and at least one processor communicatively coupled to the current measurement subsystem, wherein, in operation, the at least one processor: receives the sensor current signal from the current measurement subsystem; and determines the AC voltage in the insulated conductor based at least in part on the received sensor current signal, the AC reference voltage and the reference frequency. In operation, the current measurement subsystem may receive an input current from the conductive sensor, and the sensor current signal may include a voltage signal indicative of the input current received from the conductive sensor. The current measurement subsystem may include an operational amplifier, which may operate as a current-to-voltage converter. The at least one processor, in operation, may convert the received sensor current signal to a digital signal; and process the digital signal to obtain a frequency domain representation of the sensor current signal. The at least one processor may implement a fast Fourier transform (FFT) to obtain the frequency domain representation of the sensor current signal. The common mode reference voltage source may generate the AC reference voltage in phase with a window of the FFT implemented by the at least one processor. The at least one processor may include at least one electronic filter which filters the received sensor current signal. The at least one processor may process the sensor current signal to determine an insulated conductor current component and a reference current component, the insulated conductor current component indicative of the current conducted through the conductive sensor due to the voltage in the insulated conductor, and the reference current component indicative of the current conducted through the conductive sensor due to the voltage of the common mode reference voltage source. The at least one processor may determine the frequency of the determined insulated conductor current component of the sensor current signal. The at least one processor may determine the AC voltage in the insulated conductor based on the insulated conductor current component, the reference current component, the frequency of the insulated conductor current component, the reference frequency and the AC reference voltage. The at least one processor may process the sensor current signal to determine the frequency of the voltage in the insulated conductor. The common mode reference voltage source may include a digital-to-analog converter (DAC). The conductive reference shield may at least partially surround the conductive internal ground guard. The conductive sensor and the conductive internal ground guard each may be non-planar in shape. At least a portion of the conductive reference shield may be cylindrical in shape. The conductive internal ground guard may include a surface including a guard aperture, and the conductive sensor may be recessed relative to the surface of the internal ground guard which comprises the guard aperture. The at least one processor may obtain a first sensor current signal when the common mode reference voltage source is disabled, may obtain a second sensor current signal when the common mode reference voltage source is enabled, and may determine the AC voltage in the insulated conductor based at least in part on the first and second sensor current signals, the AC reference voltage and the reference frequency.

A method of operating a system to measure alternating current (AC) voltage in an insulated conductor, the system including a housing, a conductive sensor physically coupled to the housing which is selectively positionable proximate an insulated conductor without galvanically contacting the conductor, a conductive internal ground guard which at least partially surrounds the conductive sensor and is galvanically isolated from the conductive sensor, wherein the internal ground guard is sized and dimensioned to shield the conductive sensor from stray currents, a conductive reference shield which surrounds at least a portion of the housing and is galvanically insulated from the internal ground guard, wherein the conductive reference shield is sized and dimensioned to reduce currents between the internal ground guard and an external ground, may be summarized as including causing a common mode reference voltage source to generate an alternating current (AC) reference voltage having a reference frequency, the common mode reference voltage source electrically coupled between the internal ground guard and the conductive reference shield; generating, via a current measurement subsystem electrically coupled to the conductive sensor, a sensor current signal indicative of current conducted through the conductive sensor; receiving, by at least one processor, the sensor current signal from the current measurement subsystem; and determining, by at least one processor, the AC voltage in the insulated conductor based at least in part on the received sensor current signal, the AC reference voltage and the reference frequency. Generating the sensor current signal may include receiving an input current from the conductive sensor; and generating a voltage signal indicative of the input current received from the conductive sensor. The sensor current signal may be generated utilizing an operational amplifier operating as a current-to-voltage converter. Determining the AC voltage in the insulated conductor may include converting, by at least one processor, the received sensor current signal to a digital signal; and processing, by at least one processor, the digital signal to obtain a frequency domain representation of the sensor current signal. Processing the digital signal may include implementing a fast Fourier transform (FFT) to obtain the frequency domain representation of the sensor current signal. Determining the AC voltage in the insulated conductor may include electronically filtering the received sensor current signal. Determining the AC voltage in the insulated conductor may include processing the sensor current signal to determine an insulated conductor current component and a reference current component, wherein the insulated conductor current component may be indicative of the current conducted through the conductive sensor due to the voltage in the insulated conductor, and the reference current component may be indicative of the current conducted through the conductive sensor due to the voltage of the common mode reference voltage source. Determining the AC voltage in the insulated conductor may include determining the frequency of the determined insulated conductor current component of the sensor current signal. The AC voltage in the insulated conductor may be determined based on the insulated conductor current component, the reference current component, the frequency of the insulated conductor current component, the reference frequency and the AC reference voltage. Determining the AC voltage in the insulated conductor may include processing the sensor current signal to determine the frequency of the voltage in the insulated conductor. Determining the AC voltage in the insulated conductor may include obtaining, by at least one processor, a first sensor current signal when the common mode reference voltage source is disabled; obtaining, by at least one processor, a second sensor current signal when the common mode reference voltage source is enabled; and determining, by at least one processor, the AC voltage in the insulated conductor based at least in part on the first and second sensor current signals, the AC reference voltage and the reference frequency.

A system to measure alternating current (AC) voltage in an insulated conductor may be summarized as including a housing; a conductive sensor physically coupled to the housing, the conductive sensor selectively positionable proximate the insulated conductor without galvanically contacting the conductor, wherein the conductive sensor capacitively couples with the insulated conductor; a conductive internal ground guard which at least partially surrounds the conductive sensor and is galvanically isolated from the conductive sensor; a conductive reference shield which surrounds at least a portion of the housing and is galvanically insulated from the internal ground guard; a common mode reference voltage source which, in operation, generates an alternating current (AC) reference voltage having a reference frequency, the common mode reference voltage source electrically coupled between the internal ground guard and the conductive reference shield; a measurement subsystem electrically coupled to the conductive sensor, wherein the measurement subsystem, in operation, detects current conducted through the conductive sensor; and at least one processor communicatively coupled to the measurement subsystem, wherein, in operation, the at least one processor: receives a signal indicative of the detected current from the measurement subsystem; and determines the AC voltage in the insulated conductor based at least in part on the received signal, the AC reference voltage and the reference frequency.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations. As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure are directed to systems and methods for measuring alternating current (AC) voltage of an insulated or blank uninsulated conductor (e.g., insulated wire) without requiring a galvanic connection between the conductor and a test electrode or probe. Generally, a non-galvanic contact (or "non-contact") voltage measurement system is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise.

Figure 1A:
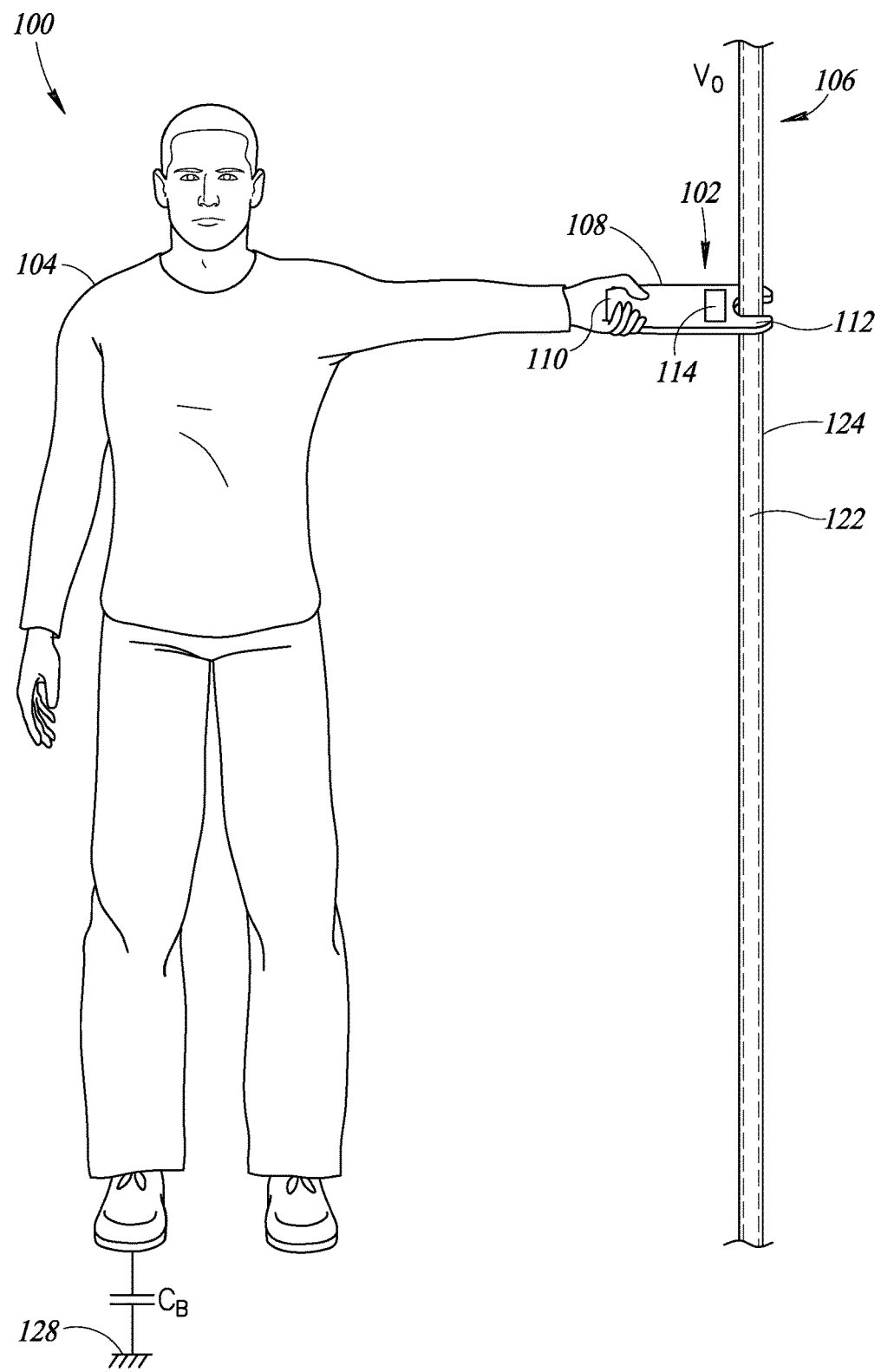
FIG. 1A is a pictorial diagram of an environment in which a non-contact voltage measurement system may be used by an operator to measure AC voltage present in an insulated wire without requiring galvanic contact with the wire, according to one illustrated implementation.
Figure 1B:
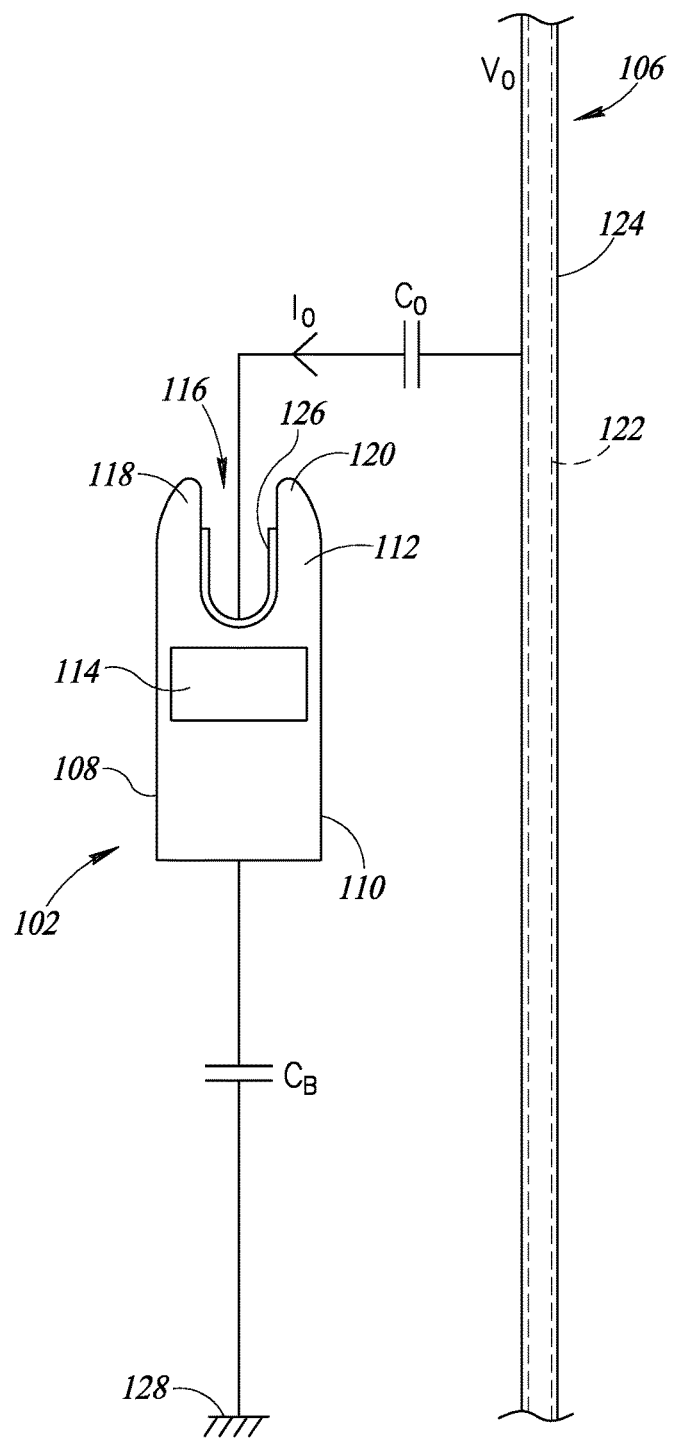
FIG. 1B is a top view of the non-contact voltage measurement system of FIG. 1A, showing a coupling capacitance formed between the insulated wire and a conductive sensor of the non-contact voltage measurement system, an insulated conductor current component, and a body capacitance between the non-contact voltage measurement system and the operator, according to one illustrated implementation.

FIG. 1A is a pictorial diagram of an environment 100 in which a non-contact voltage measurement system 102 of the present disclosure may be used by an operator 104 to measure AC voltage present in an insulated wire 106 without requiring galvanic contact between the non-contact voltage measurement system and the wire 106. FIG. 1B is a top plan view of the non-contact voltage measurement system 102 of FIG. 1A, showing various electrical characteristics of the non-contact voltage measurement system during operation. The non-contact voltage measurement system 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement system 102. The user interface 114 may include any number of inputs (e.g., buttons, dials, switches, touch sensor) and any number of outputs (e.g., display, LEDs, speakers, buzzers). The non-contact voltage measurement system 102 may also include one or more wired and/or wireless communications interfaces (e.g., USB, Wi-Fi®, Bluetooth®).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a sensor or electrode 126 which rests proximate the insulator 124 of the insulated wire 106 when the insulated wire is positioned within the recessed portion 116 of the non-contact voltage measurement system 102. Although not shown for clarity, the sensor 126 may be disposed inside of the housing 108 to prevent physical and electrical contact between the sensor and other objects.

As shown in FIG. 1A, in use the operator 104 may grasp the grip portion 110 of the housing 108 and place the probe portion 112 proximate the insulated wire 106 so that the non-contact voltage measurement system 102 may accurately measure the AC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement system 102 to be positioned proximate the insulated wire 106. Examples of various probe portions and sensors are discussed below with reference to FIGS. 10-15.

The operator's body acting as a reference to earth/ground may only be in some implementations. The non-contact measurement functionality discussed herein is not limited to applications only measuring against earth. The outside reference may be capacitively coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement system 102 may utilize the body capacitance ($C_B$) between the operator 104 and ground 128 during the AC voltage measurement. Although the term ground is used for the node 128, the node is not necessarily earth/ground but could be connected in a galvanically isolated manner to any other reference potential by capacitive coupling.

The particular systems and methods used by the non-contact voltage measurement system 102 to measure AC voltage are discussed below with reference to FIGS. 2-15.

Figure 2:
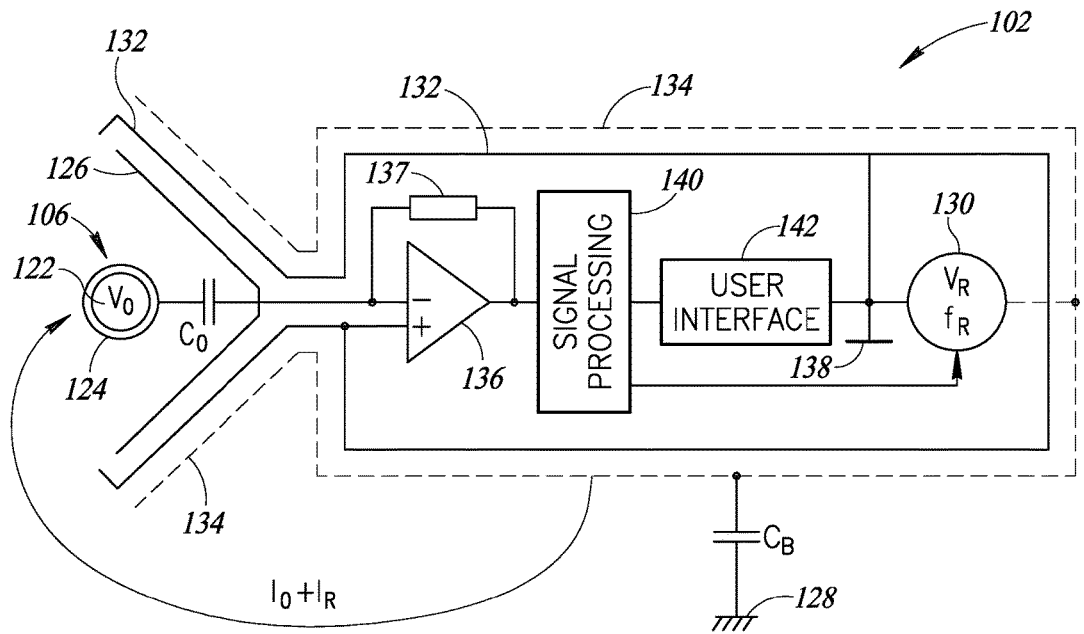
FIG. 2 is a schematic diagram of various internal components of a non-contact voltage measurement system, according to one illustrated implementation.

FIG. 2 shows a schematic diagram of various internal components of the non-contact voltage measurement system 102 also shown in FIGS. 1A and 1B. In this example, the conductive sensor 126 of the non-contact voltage measurement system 102 is substantially "V-shaped" and is positioned proximate the insulated wire 106 under test and capacitively couples with the conductor 122 of the insulated wire 106, forming a sensor coupling capacitor ($C_O$). The operator 104 handling the non-contact voltage measurement system 102 has a body capacitance ($C_B$) to ground. Thus, as shown in FIGS. 1B and 2, the AC voltage signal ($V_O$) in the wire 122 generates an insulated conductor current component or "signal current" ($J_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 122 to be measured has a connection to an external ground 128 (e.g., neutral). The non-contact voltage measurement system 102 itself also has a capacitance to ground 128, which consists primarily of the body capacitance ($C_B$) when the operator 104 (FIG. 1) holds the non-contact voltage measurement system in his hand. Both capacitances $C_O$ and $C_B$ create a conductive loop and the voltage inside the loop generates the signal current ($J_O$). The signal current ($I_O$) is generated by the AC voltage signal ($V_O$) capacitively coupled to the conductive sensor 126 and loops back to the external ground 128 through the housing 108 of the non-contact voltage measurement system and the body capacitor ($C_B$) to ground 128. The current signal ($J_O$) is dependent on the distance between the conductive sensor 126 of the non-contact voltage measurement system 102 and the insulated wire 106 under test, the particular shape of the conductive sensor 126, and the size and voltage level ($V_O$) in the conductor 122.

To compensate for the distance variance and consequent coupling capacitor ($C_O$) variance which directly influences the signal current ($J_O$), the non-contact voltage measurement system 102 includes a common mode reference voltage source 130 which generates an AC reference voltage ($V_R$) which has a reference frequency ($f_R$).

To reduce or avoid stray currents, at least a portion of the non-contact voltage measurement system 102 may be surrounded by a conductive internal ground guard or screen 132 which causes most of the current to run through the conductive sensor 126 which forms the coupling capacitor ($C_O$) with the conductor 122 of the insulated wire 106 The internal ground guard 132 may be formed from any suitable conductive material (e.g., copper) and may be solid (e.g., foil) or have one or more openings (e.g., mesh).

Further, to avoid currents between the internal ground guard 132 and the external ground 128, the non-contact voltage measurement system 102 includes a conductive reference shield 134. The reference shield 134 may be formed from any suitable conductive material (e.g., copper) and may be solid (e.g., foil) or have one or more openings (e.g., mesh). The common mode reference voltage source 130 is electrically coupled between the reference shield 134 and the internal ground guard 132, which creates a common mode voltage having the reference voltage ($V_R$) and the reference frequency ($f_R$) for the non-contact voltage measurement system 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$) between the conductive sensor 126 and the reference shield 134. As noted above, the internal ground guard 132 is the internal electronic ground 138 for the non-contact voltage measurement system 102. In at least some implementations, the internal ground guard 132 also surrounds some or all of the electronics of the non-contact voltage measurement system 102 to avoid the AC reference voltage ($V_R$) coupling into the electronics.

As noted above, the reference shield 134 is utilized to inject a reference signal onto the input AC voltage signal ($V_O$) and as a second function minimizes the guard 132 to earth ground 128 capacitance. In at least some implementations, the reference shield 134 surrounds some or all of the housing 108 of the non-contact voltage measurement system 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement system 102.

The internal ground guard 132 and the reference shield 134 may provide a double layer screen around the housing 108 (see FIG. 1A and 1B) of the non-contact voltage measurement system 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test.

The guard 132 around the sensor 126 also reduces stray influences of adjacent wires close to the sensor.

As shown in FIG. 2, the non-contact voltage measurement system 102 may include an input amplifier 136 which operates as an inverting current-to-voltage converter. The input amplifier 136 has a non-inverting terminal electrically coupled to the internal ground guard 132 which functions as the internal ground 138 of the non-contact voltage measurement system 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives the signal current ($I_O$) and reference current ($I_R$) from the conductive sensor 126 and converts the received currents into a sensor current voltage signal indicative of the conductive sensor current at the output terminal of the input amplifier. The sensor current voltage signal may be an analog voltage, for example. The analog voltage may be fed to a signal processing module 140 which, as discussed further below, processes the sensor current voltage signal to determine the AC voltage ($V_O$) in the conductor 122 of the insulated wire 106. The signal processing module 140 may include any combination of digital and/or analog circuitry.

The non-contact voltage measurement system 102 may also include a user interface 142 (e.g., display) communicatively coupled to the signal processing module 140 to present the determined AC voltage ($V_O$) or to communicate by an interface to the operator 104 of the non-contact voltage measurement system.

Figure 3:
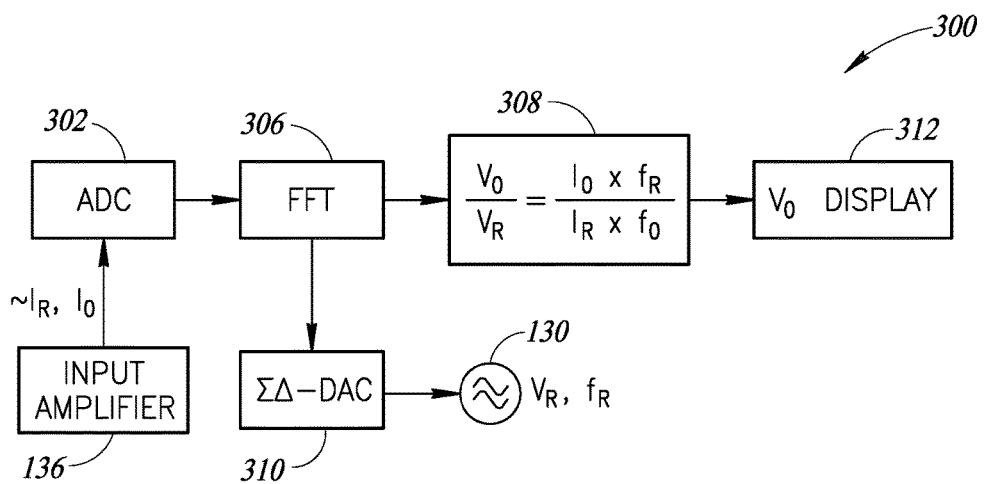
FIG. 3 is a block diagram which shows various signal processing components of a non-contact voltage measurement system, according to one illustrated implementation.
Figure 4:
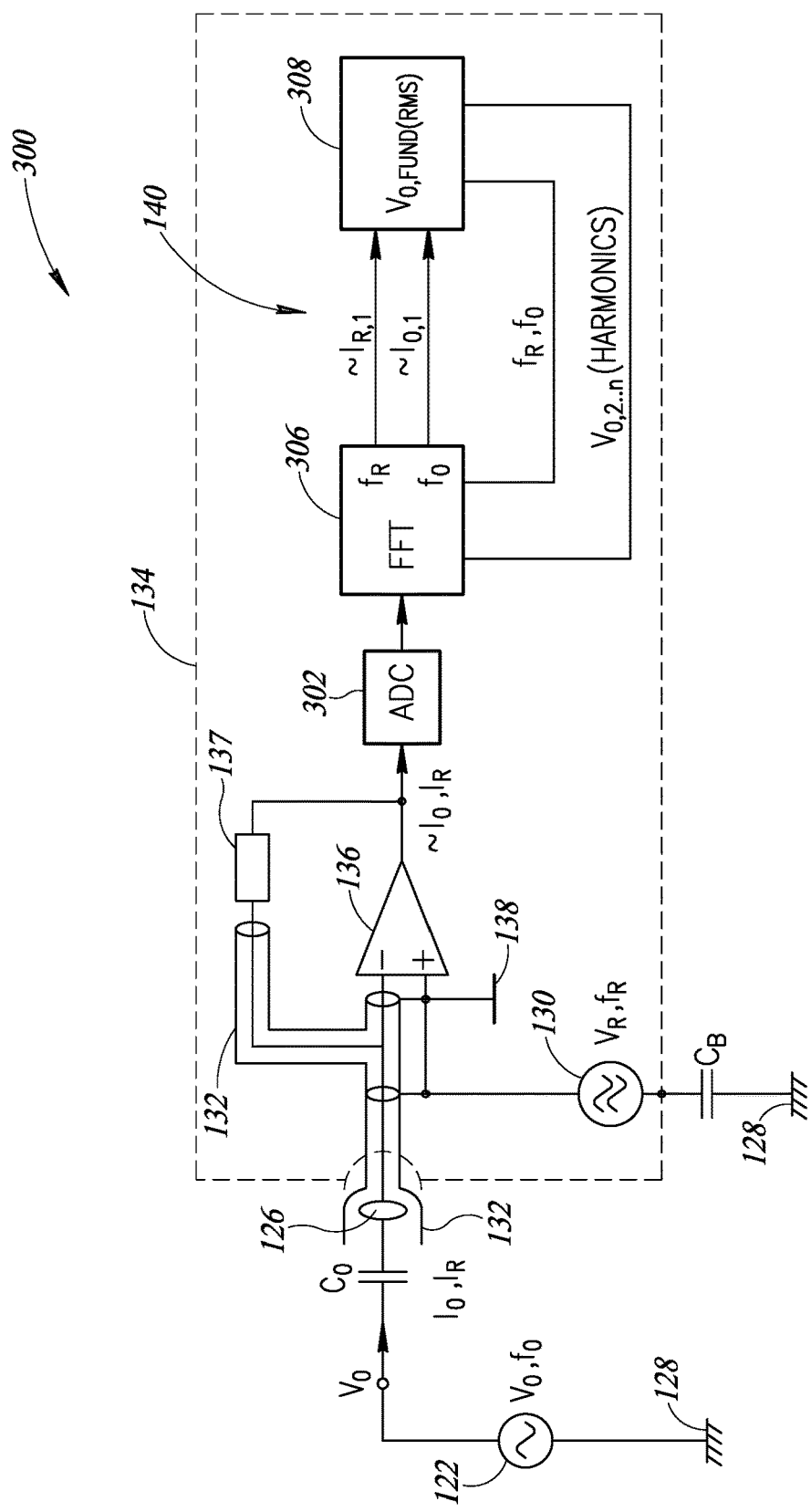
FIG. 4 is a schematic diagram of a non-contact voltage measurement system which implements a fast Fourier transform (FFT), according to one illustrated implementation.

FIG. 3 is a block diagram of a non-contact voltage measurement system 300 which shows various signal processing components of the non-contact voltage measurement system. FIG. 4 is a more detailed diagram of the non-contact voltage measurement system 300 of FIG. 3.

The non-contact voltage measurement system 300 may be similar or identical to the non-contact voltage measurement system 102 discussed above. Accordingly, similar or identical components are labeled with the same reference numerals. As shown, the input amplifier 136 converts the input current ($I_O+I_R$) from the conductive sensor 126 into a sensor current voltage signal which is indicative of the input current. The sensor current voltage signal is converted into digital form using an analog-to-digital converter (ADC) 302.

The AC voltage ($V_O$) in the wire 122 is related to the AC reference voltage ($V_R$) by Equation (1):

$$\frac{V_O}{V_R} = \frac{I_O \times f_R}{I_R \times f_O} \qquad (1)$$

where ($I_O$) is the signal current through the conductive sensor 126 due to the AC voltage ($V_O$) in the conductor 122, ($I_R$) is the reference current through the conductive sensor 126 due to the AC reference voltage ($V_R$), ($f_O$) is the frequency of the AC voltage ($V_O$) that is being measured, and ($f_R$) is the frequency of the reference AC voltage ($V_R$).

Figure 5:
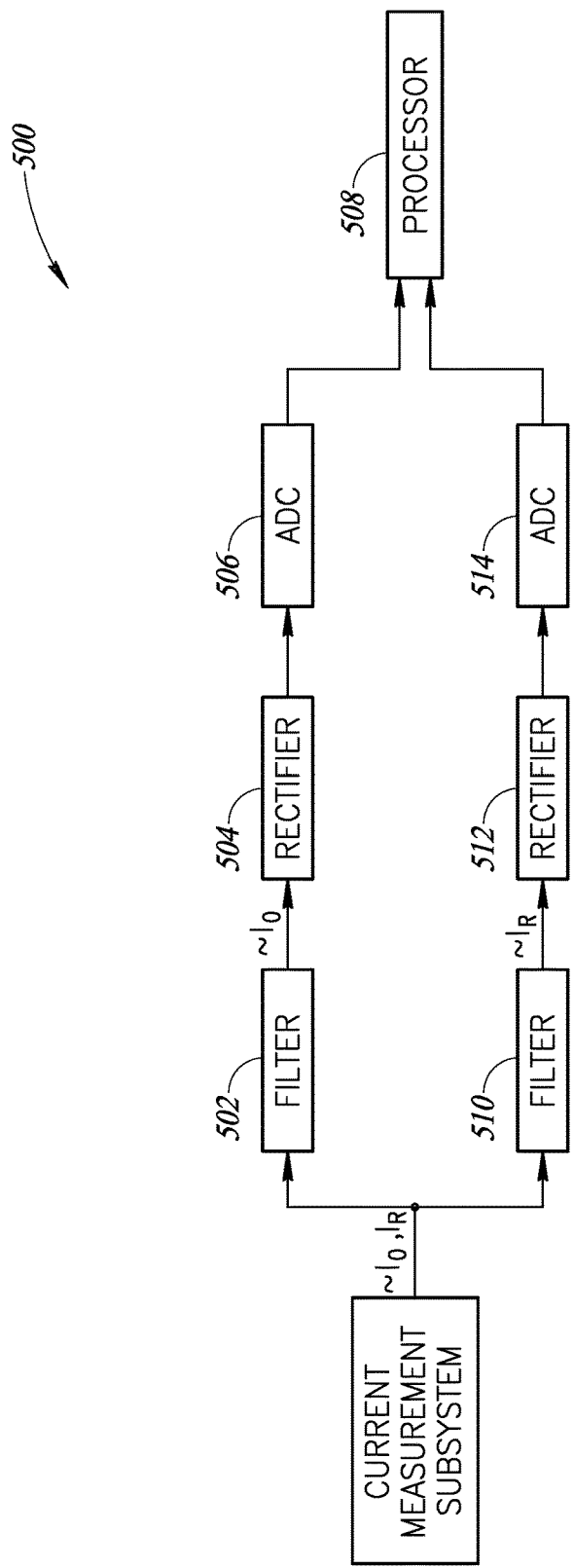
FIG. 5 is a block diagram of a non-contact voltage measurement system which implements analog electronic filters, according to another example for signal and reference signal separation.

The signals with indices "O," which are related to the AC voltage ($V_O$), have different frequencies than the signals with indices "R," which are related to the common mode reference voltage source 130. In the implementation of FIG. 4, digital processing, such as circuitry implementing a fast Fourier transform (FFT) algorithm 306, may be used to separate signal magnitudes. In the implementation of FIG. 5 discussed below, analog electronic filters may be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 122 under test needs either to be measured to determine the ratio of the reference frequency ($f_R$) to the signal frequency ($f_O$), which is utilized in Equation (1) listed above or the reference frequency is already known because it is generated by the system itself.

After the input current ($I_O+I_R$) has been conditioned by the input amplifier 136 and digitized by the ADC 302, the frequency components of the digital sensor current voltage signal may be determined by representing the signal in the frequency domain using the FFT 306. When both of the frequencies ($f_O$) and ($f_R$) have been measured, frequency bins may be determined to calculate the fundamental magnitudes of the currents ($I_O$) and ($I_R$) from the FFT 306.

Next, as indicated by a block 308, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 122, which may be presented to the user on a display 312.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126. The body capacitance ($C_B$) may have a capacitance value of approximately 20 pF to 200 pF, for example.

From Equation (1) above, it can be seen that the AC reference voltage ($V_R$) generated by the common mode reference voltage source 130 does not need to be in the same range as the AC voltage ($V_O$) in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 122 to produce currents ($I_R$) and ($J_O$) which are in the same range as each other to achieve a similar uncertainty for $I_R$ and $J_O$.

Any suitable signal generator may be used to generate the AC reference voltage ($V_R$) having the reference frequency ($f_R$). In the example illustrated in FIG. 3, a Sigma-Delta digital-to-analog converter (τ-Δ DAC) 310 is used. The τ-Δ DAC 310 uses a bit stream to create a waveform (e.g., sinusoidal waveform) signal with the defined reference frequency ($f_R$) and AC reference voltage ($V_R$). In at least some implementations, the τ-Δ DAC 310 may generate a waveform that is in phase with the window of the FFT 306 to reduce jitter.

In at least some implementations, the ADC 302 may have 14 bits of resolution. In operation, the ADC 302 may sample the output from the input amplifier 136 at a sampling frequency of 10.24 kHz for nominal 50 Hz input signals to provide $2^n$ samples (1024) in 100 ms (10 Hz bins for the FFT 306) ready for processing by the FFT 306. For 60 Hz input signals, the sampling frequency may be 12.28 kHz, for example. The sampling frequency of the ADC 302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 306 and use a Hanning window function for further calculations to suppress phase shift jitter caused by incomplete signal cycles captured in the aggregation interval.

In one example, the common mode reference voltage source 130 generates an AC reference voltage ($V_R$) which has a reference frequency ($f_R$) of 2419 Hz. This frequency is in between the $40^{th}$ harmonic and the $41^{st}$ harmonic for 60 Hz signals, and between the $48^{th}$ harmonic and $49^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 130 is selected to be a frequency that is least likely to be affected by harmonics of an AC voltage ($V_O$) in the conductor 122 under test. As an example, the common mode reference voltage source 130 may be switched off when the reference current ($I_R$) exceeds a limit, which may indicate that the conductive sensor 126 is approaching the conductor 122 under test. A measurement (e.g., 100 ms measurement) may be taken with the common mode reference voltage source 130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results.

FIG. 5 is a block diagram of a signal processing portion 500 of a non-contact voltage measurement system which implements electronic filters. The signal processing portion 500 may receive a sensor current voltage signal that is proportional to the conductive sensor 126 current ($I_O+I_R$) from a current measurement subsystem (e.g., input amplifier 136).

As discussed above, the signal current ($I_O$) has a different frequency than the reference current ($I_R$). To isolate the signal current ($I_O$) from the reference current ($I_R$), the signal processing portion 500 may include a first filter 502 which operates to pass the signal current ($I_O$) and reject the reference current ($I_R$). The filtered signal may then be rectified by a first rectifier 504 and digitized by a first ADC 506. The digitized signal may be fed to a suitable processor 508 for use in calculations, as discussed above. Similarly, to isolate the reference current ($I_R$) from the signal current ($I_O$), the signal processing portion 500 may include a second filter 510 which operates to pass the reference current ($I_R$) and reject the signal current ($I_O$). The filtered signal may then be rectified by a second rectifier 512 and digitized by a second ADC 514. The digitized signal may be fed to a suitable processor 508 for use in calculations. The first and second filters 502 and 510 may be any suitable analog filters, and may each include a number of discrete components (e.g., capacitors, inductors).

Figure 6:
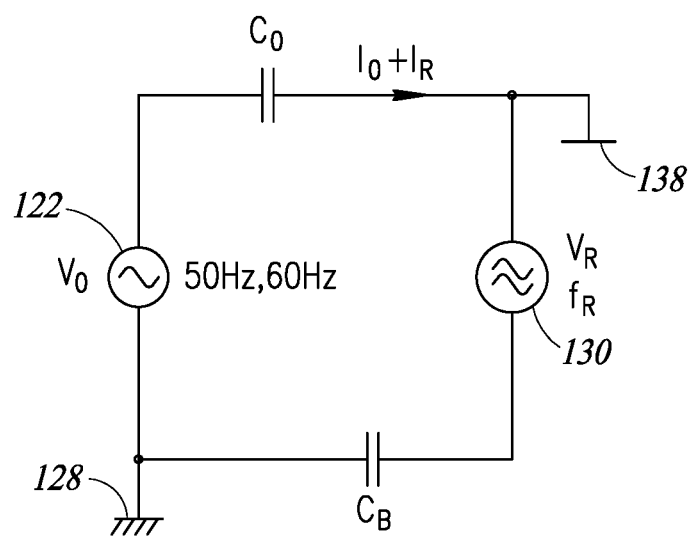
FIG. 6 is a schematic circuit diagram of a non-contact voltage measurement system, according to one illustrated implementation.

FIG. 6 is a schematic circuit diagram of portions of a non-contact voltage measurement system, such as any of the non-contact voltage measurement systems discussed above, showing the loop formed by the common mode reference voltage source 130, the body capacitance ($C_B$), the coupling capacitor ($C_O$), the wire 122, the external ground 128, and the internal ground 138.

Figure 7A:
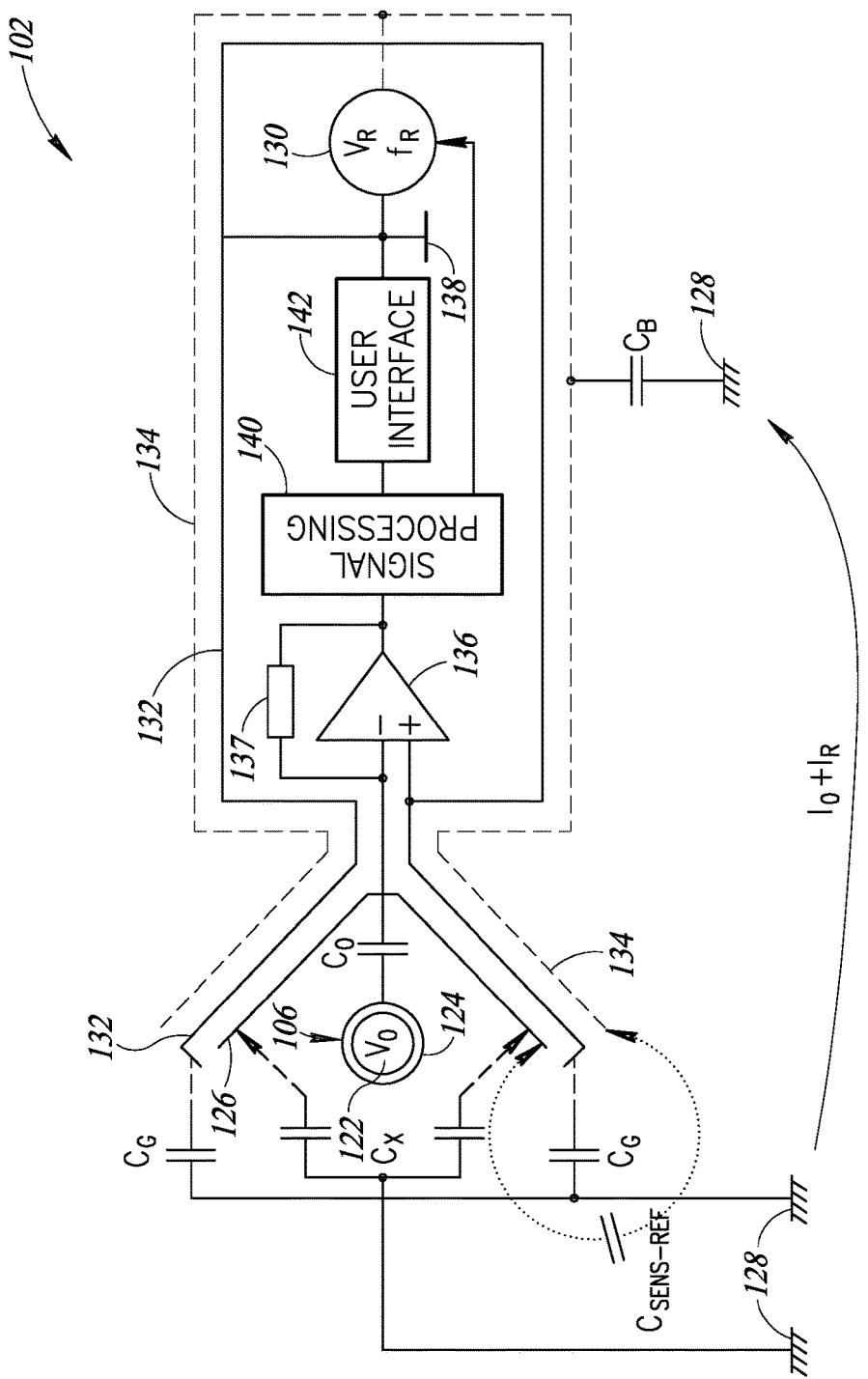
FIG. 7A is a schematic diagram of a non-contact voltage measurement system which shows various leakage and stray capacitances, according to one illustrated implementation.

FIG. 7A is a schematic diagram of the non-contact voltage measurement system 102, which shows various leakage and stray capacitances. Generally, removal of the influences of different stray capacitors seen by the system (e.g., sensor 126) cannot be completely achieved by special sensor design and screening methods even with sophisticated shielding techniques. As discussed above, implementations of the present disclosure utilize the common mode reference voltage source 130 to generate a reference voltage with a reference frequency ($f_R$) that is different from the measured signal frequency ($f_O$) to compensate for the stray capacitances seen by the system.

In particular, in addition to the coupling capacitor ($C_O$), FIG. 7A shows the body capacitance ($C_B$), a capacitance ($C_X$), a capacitance ($C_{SENS-REF}$), and a capacitance ($C_G$). The body capacitance ($C_B$) is in series with the coupling capacitor ($C_O$) and, in typical applications, the body capacitance ($C_B$) is much greater than the coupling capacitor ($C_O$). Thus, the body capacitance ($C_B$) only impacts the magnitudes of the currents ($I_O+I_R$), but does not impact the ratio ($I_O/I_R$) of the currents.

Figure 8:
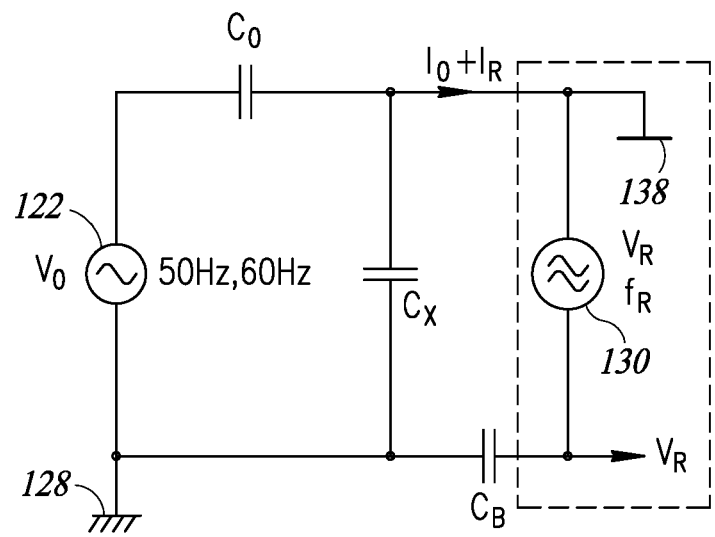
FIG. 8 is a schematic circuit diagram of a non-contact voltage measurement system which shows a capacitance between a sensor of the non-contact voltage measurement system and an external ground, according to one illustrated implementation.

As shown in FIGS. 7A and 8, the capacitance ($C_X$) is the sensor capacitance between the conductive sensor 126 and the external ground 128. The coupling capacitor ($C_O$) is not the only capacitance between the wire 122 and the sensor 126. There is also the capacitance ($C_X$) between the sensor 126 and the external ground 128, especially for thin wires which do not substantially cover the area of the sensor 126. The capacitance ($C_X$) has a capacitive voltage divider effect for the signal current ($J_O$), and may result in a lower voltage measurement for the AC voltage ($V_O$). The capacitance ($C_X$) therefore reduces the magnitudes of the currents ($I_O+I_R$). However, the reference current ($I_R$) is divided by the same ratio and, thus, also compensates for the stray capacitor ($C_X$), so the ratio ($I_O/I_R$) is not impacted. To also avoid any internal current flows to outside the non-contact voltage measurement system, as discussed above in at least some implementations the whole measurement system except for the sensing area may be shielded by the reference shield 134 from the outside environment and connected to the output of the common mode reference voltage source 130 to create the reference current ($I_R$).

As shown in FIG. 7A, the capacitance ($C_{SENS-REF}$) is the remaining capacitance between the reference shield 134 and the conductive sensor 126. The capacitance ($C_{SENS-REF}$) causes an offset for the sensor current ($I_O+I_R$) which is present even when the AC voltage ($V_O$) in the wire 106 is not being measured.

Figure 9A:
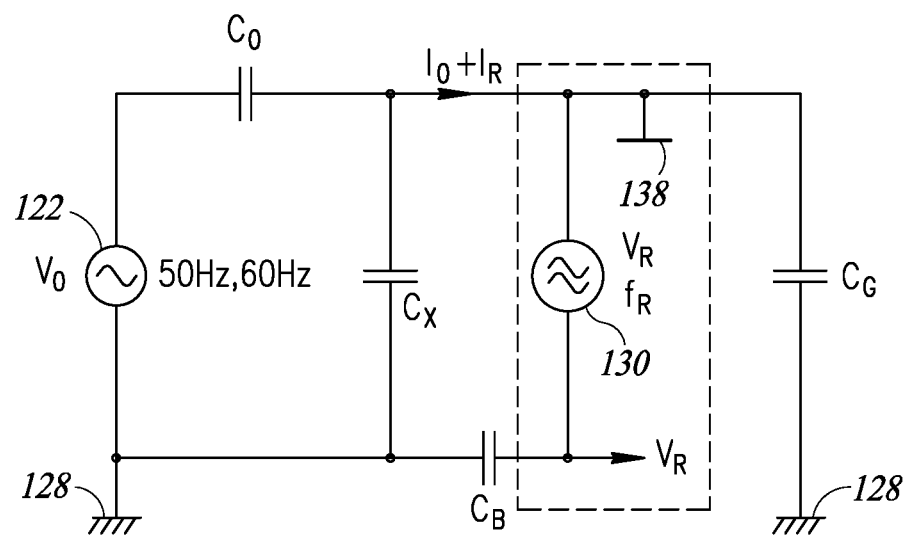
FIG. 9A is a schematic circuit diagram of a non-contact voltage measurement system which shows a capacitance between an internal ground guard of the non-contact voltage measurement system and an external ground, according to one illustrated implementation.
Figure 9B:
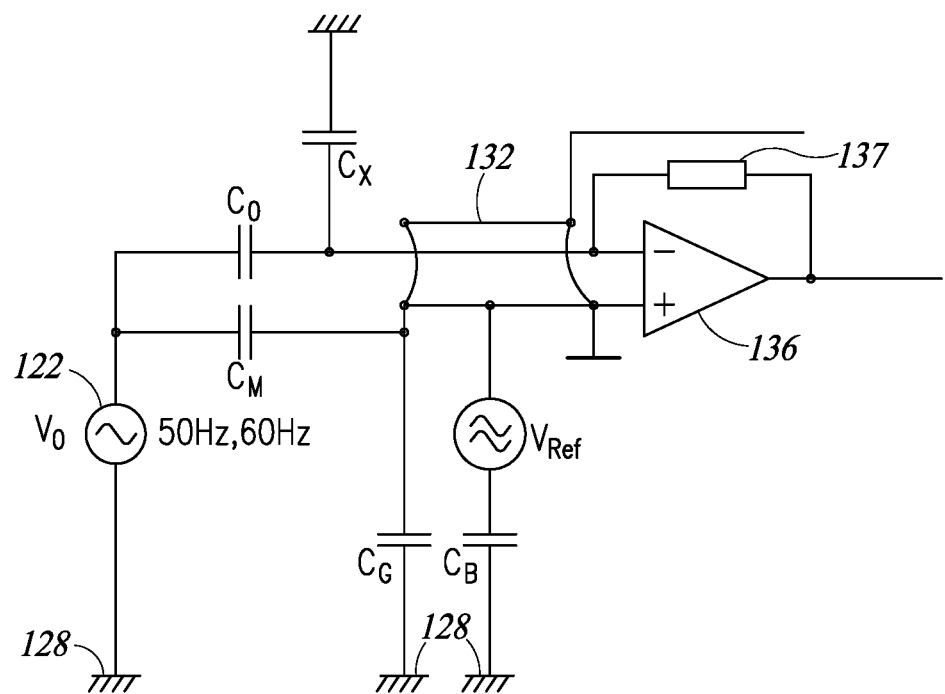
FIG. 9B is a schematic circuit diagram of a non-contact voltage measurement system which shows a capacitance between an internal ground guard of the non-contact voltage measurement system and an external ground, according to one illustrated implementation.

As shown in FIGS. 7A and 9A, the capacitance ($C_G$) is the capacitance between the internal ground 138 and the external ground 128 or reference potential. The capacitance ($C_G$) is a parallel path for the reference current ($I_R$), and reduces the reference current. Thus, the capacitance ($C_G$) causes an increase in the calculated result for the AC voltage ($V_O$) in the wire 106. See FIG. 9B, which shows the impact of the capacitance ($C_G$). In particular, the capacitance ($C_G$) influences $I_R$ and $I_O$ differently, and therefore influences the ratio $I_O/I_R$.

$$I_O = V_O \cdot f_O \cdot \frac{[(C_O // C_M) \text{ in series } (C_G // C_B)] \cdot C_O}{C_O // C_M} = \qquad (2)$$

$$= V_O \cdot f_O \cdot \frac{(C_O + C_M)(C_G + C_B) \cdot C_O}{(C_O + C_M + C_B + C_G) \cdot (C_O + C_M)} \Rightarrow \frac{C_O \cdot (C_B + C_G)}{\sum C} \qquad (3)$$

$$I_R = V_R \cdot f_R \cdot \frac{((C_B \text{ in series } (C_O // C_M // C_G)) \cdot C_O}{C_O // C_M // C_G} = \qquad (4)$$

$$= V_R \cdot f_R \cdot \frac{C_B \cdot (C_O + C_M + C_G) \cdot C_O}{(C_B + C_O + C_M + C_G) \cdot (C_O + C_M + C_G)} \Rightarrow \frac{C_O \cdot C_B}{\sum C} \qquad (5)$$

As can be seen from equations (2)-(5) above, the ratio $I_O/I_R$ depends on $C_B/C_G$. The capacitance $C_G$ is much smaller when a reference screen is around the whole enclosure and sensor of the non-contact voltage measurement system 102.

Figure 7B:
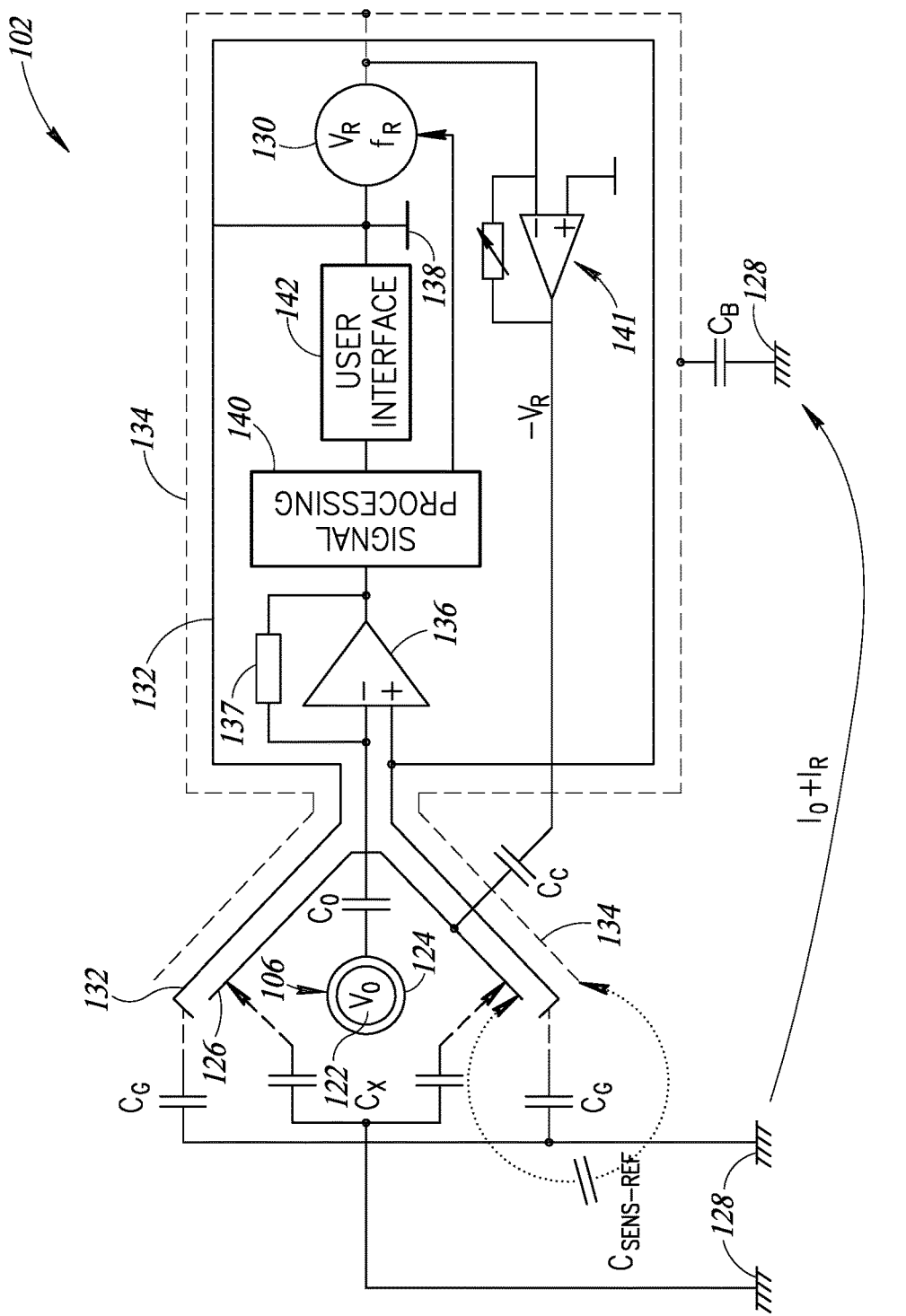
FIG. 7B is a schematic diagram of a non-contact voltage measurement system which shows various leakage and stray capacitances and includes compensation for a reference voltage signal, according to one illustrated implementation.
Figure 7C:
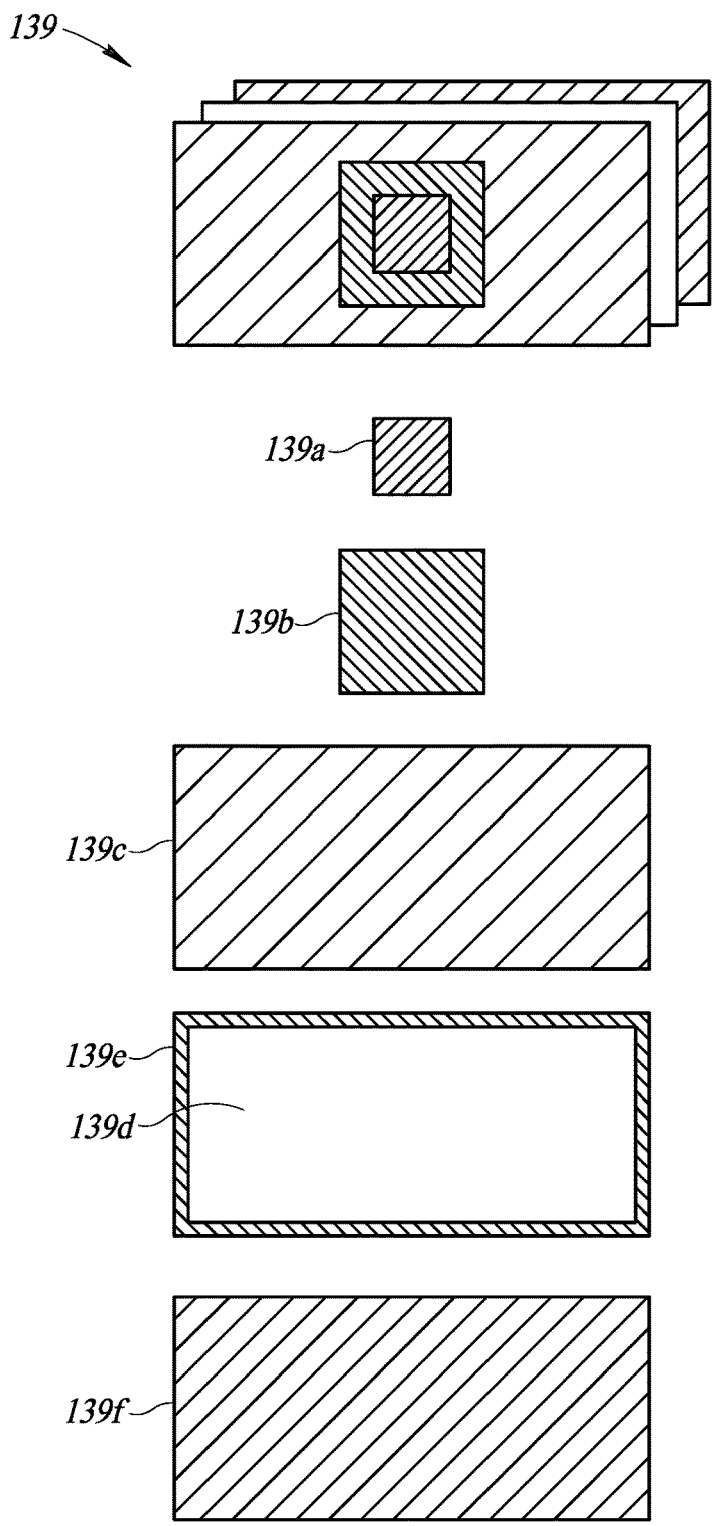
FIG. 7C shows an example sensor arrangement for the system of FIG. 7B, according to one illustrated implementation.

FIG. 7B shows an implementation which provides compensation for the impact that the reference voltage ($V_R$) has on the sensor 126 by using an inverted reference signal ($-V_R$) and an arrangement which couples the inverted reference signal to the sensor 126. FIG. 7C shows an example sensor arrangement which includes the inverted reference signal compensation.

In FIG. 7B, an adjustable inverting amplifier 141 is used to provide an inverted reference signal ($-V_R$) to the sensor 126 to compensate for the impact that the reference voltage ($+V_R$) has on the sensor. This may be achieved by a capacitive coupling ($C_C$) positioned proximate the sensor 126. The capacitive coupling ($C_C$) may be in the form of a wire, screen, shield, etc., positioned proximate the sensor. The compensation may be particularly advantageous when the insulated conductor 106 has a relatively small diameter because, in such instances, the reference voltage ($V_R$) from the reference shield 134 may have the greatest impact on the sensor 126.

FIG. 7C shows an example sensor arrangement 139 for use in an implementation which provides the aforementioned reference signal compensation. The sensor arrangement 139 includes a sensor 139a, an insulating layer 139b (e.g., Kapton® tape), an internal ground guard 139c, an inverted reference signal layer 139d ($-V_R$), an insulating layer 139e, and a reference signal layer 139f ($+V_R$).

Figure 10:
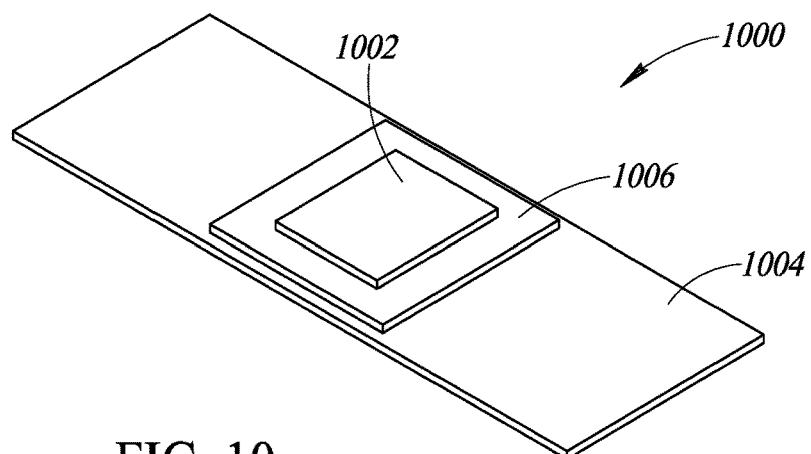
FIG. 10 is a perspective view of a sensor and internal ground guard assembly of a non-contact voltage measurement system, according to one illustrated implementation.

FIG. 10 is a perspective view of an example sensor and guard assembly 1000 for a non-contact voltage measurement system, such as any of the non-contact voltage measurement systems discussed above. In this example, the sensor and guard assembly 1000 comprises a conductive sensor 1002, an internal ground guard 1004, and an isolating layer 1006 disposed between the sensor and the internal ground guard. Generally, the sensor assembly 1000 should provide good coupling capacitance ($C_O$) between the sensor 1002 and the wire under test and should suppress the capacitance to other adjacent wires and the capacitance to the external ground. The sensor assembly 1000 should also minimize the capacitance ($C_{SENS-REF}$) between the sensor 1002 and the reference shield (e.g., reference shield 134).

As a simple example, the sensor 1002, guard 1004 and isolating layer 1006 may each comprise a piece of foil. The guard 1004 may be coupled to a carrier (see FIG. 11), the isolating layer 1006 (e.g., Kapton® tape) may be coupled to the guard, and the sensor 1004 may be coupled to the isolating layer.

Figure 11:
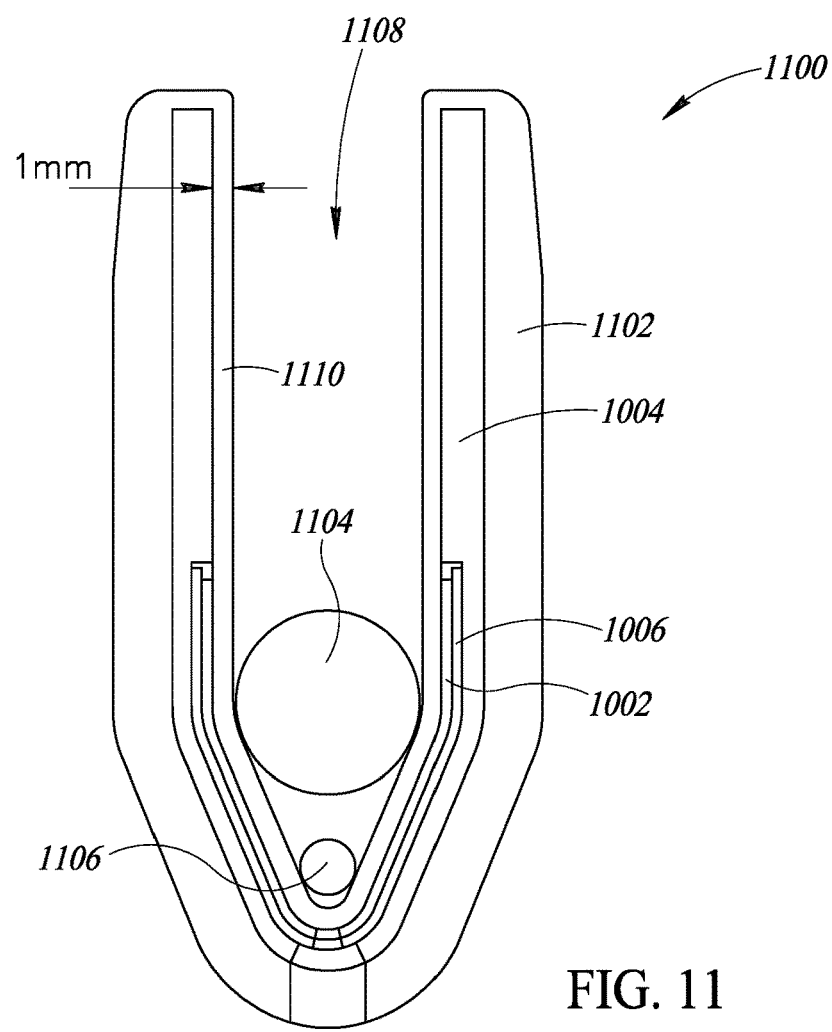
FIG. 11 is a sectional view of a "U" or "V" shaped sensor front end of a non-contact voltage measurement system, according to one illustrated implementation.

FIG. 11 shows a sectional view of an example for a sensor realization of a probe or front end 1100 of a non-contact voltage measurement system, which includes a housing layer 1102 (e.g., plastic) which covers the sensor assembly 1000 to avoid direct galvanic contact between the sensor assembly and any objects. The front end 1100 may be similar or identical to the front end 112 of the non-contact voltage measurement system 102 shown in FIGS. 1A and 1B. In this illustration, the sensor assembly 1000, including the sensor 1002, guard 1004 and isolating layer 1006, are shaped in the form of a "U" or "V," to allow the sensor assembly 1000 to surround insulated wires of different diameters, to increase the coupling capacitance ($C_O$), and to better shield, by the guard, against adjacent conductive objects.

In the example shown in FIG. 11, the sensor assembly 1000 is shaped to accommodate insulated wires of various diameters, such as an insulated wire 1104 with a relatively large diameter or an insulated wire 1106 with a relatively small diameter. In each case, the sensor assembly 1000 substantially surrounds the wire when the wire is positioned in a recessed portion 1108 of the front end 1100. A wall of the front end 1100 which defines the recessed portion 1108 and is positioned between the sensor assembly 1000 and the wire under test may be relatively thin (e.g., 1 mm), to provide galvanic isolation while still allowing for suitable capacitive coupling.

Figure 12:
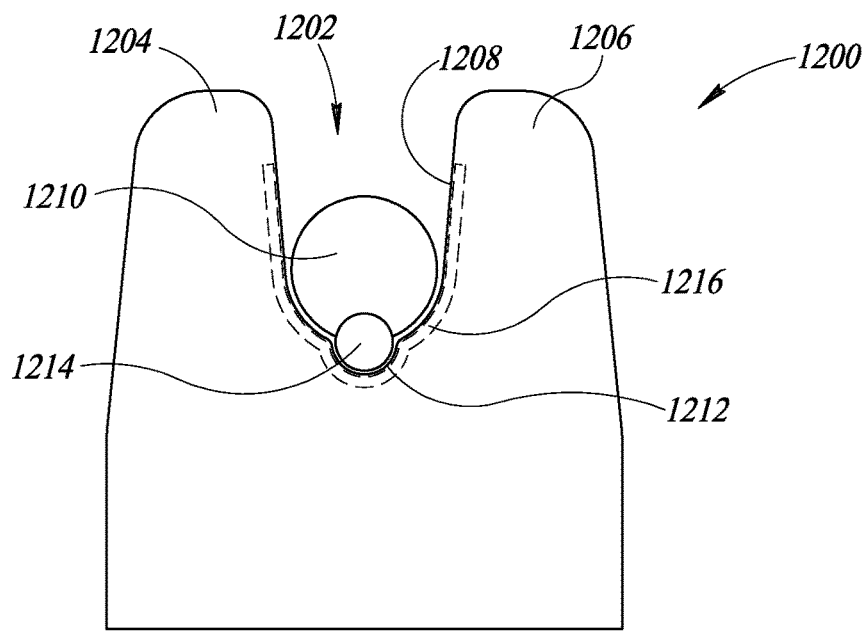
FIG. 12 is an elevational view of an arcuate-shaped sensor front end of a non-contact voltage measurement system, according to one illustrated implementation.

FIG. 12 shows an elevational view of an arcuate-shaped front end 1200 of a non-contact voltage measurement system. The front end 1200 includes a recessed portion 1202 defined by first and second extended portions 1204 and 1206. The recessed portion 1202 includes a relatively large upper arcuate-shaped portion 1208 which receives an insulated wire 1210 having a relatively large diameter. The recessed portion 1202 also includes a relatively small lower arcuate-shaped portion 1212, below the portion 1208, which receives an insulated wire 1214 having a relatively small diameter. A sensor assembly 1216, which may be similar to the sensor assembly 1000 shown in FIG. 10 and which is covered by the portions 1208 and 1212, may have a shape that substantially conforms to the arcuate-shaped portions 1208 and 1212 so that the sensor assembly 1216 substantially surrounds wires having a relatively large diameter (e.g., wire 1210) and wires having a relatively small diameter (e.g., wire 1214).

Figure 13:
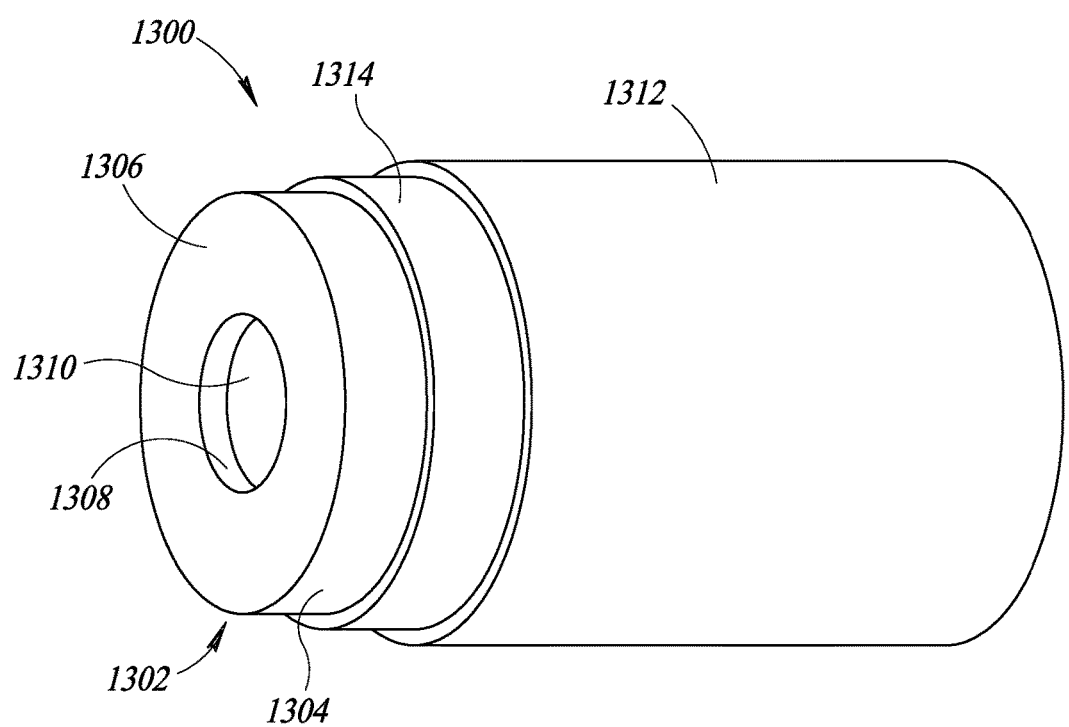
FIG. 13 is a perspective view of a cylindrically shaped sensor front end of a non-contact voltage measurement system, according to one illustrated implementation.

FIG. 13 is a perspective view of a cylindrically shaped front end 1300 of a non-contact voltage measurement system. In this example, the front end 1300 includes a cylindrically shaped internal ground guard 1302 which has a sidewall 1304 and a front surface 1306 which may be positioned proximate a wire under test. The front surface 1306 of the internal ground guard 1302 includes a central opening 1308. A conductive sensor 1310, which forms the coupling capacitor ($C_O$) together with a wire under test, is recessed behind the opening 1308 of the internal ground guard 1302 to avoid capacitive coupling with adjacent objects. The sensor 1310 may be recessed by a distance (e.g., 3 mm) from the front surface 1306 of the internal ground guard 1302, for example.

The sidewall 1304 of the internal ground guard 1302 maybe surrounded by a cylindrically shaped reference shield 1312, which is isolated from the internal ground guard by an isolating layer 1314. A common mode reference voltage source (e.g., voltage source 130) may be connected between the internal guard ground 1302 and the reference shield 1312 to provide the functionality discussed above.

Figure 14A:
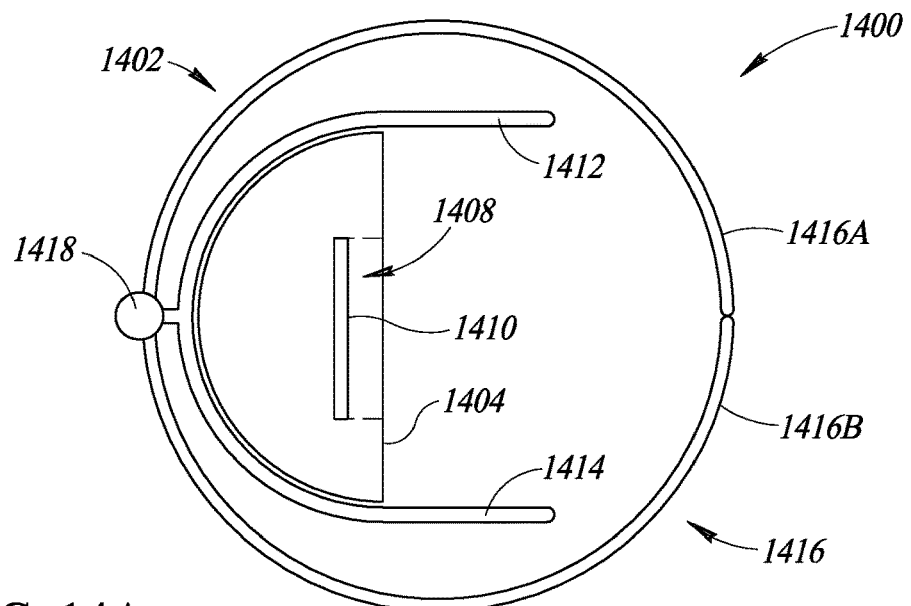
FIG. 14A is a top view of a sensor front end of a non-contact voltage measurement system when a guard ring clamp of an internal ground guard is in a closed position, according to one illustrated implementation.
Figure 14B:
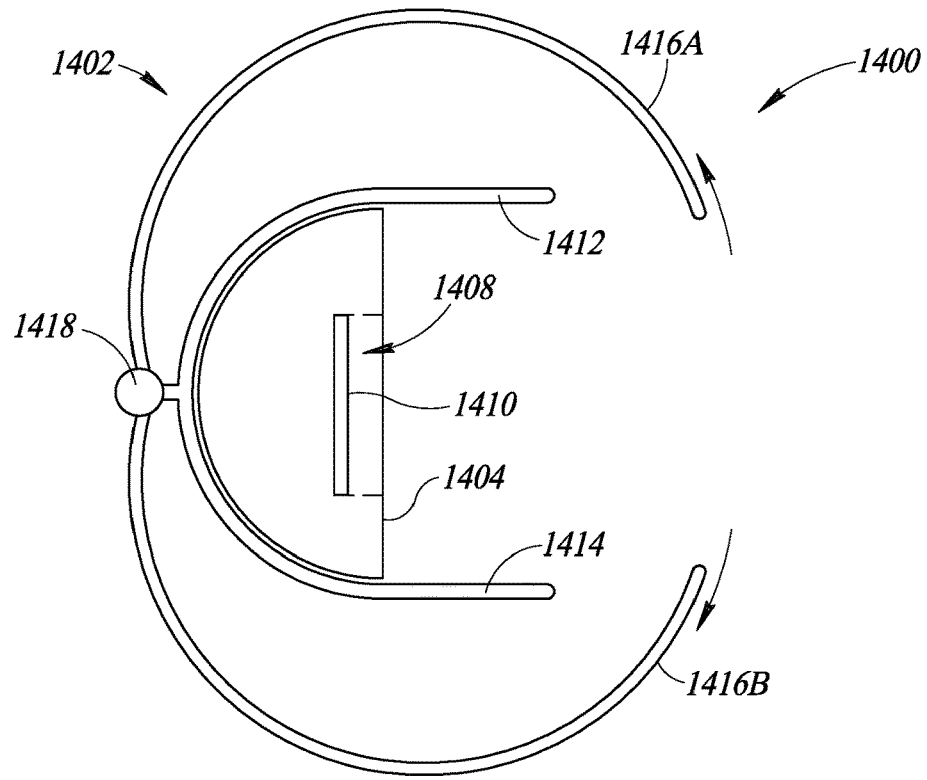
FIG. 14B is a top view of the front end of a non-contact voltage measurement system shown in FIG. 14A when the guard ring clamp of the internal ground guard is in an opened position, according to one illustrated implementation.
Figure 15:
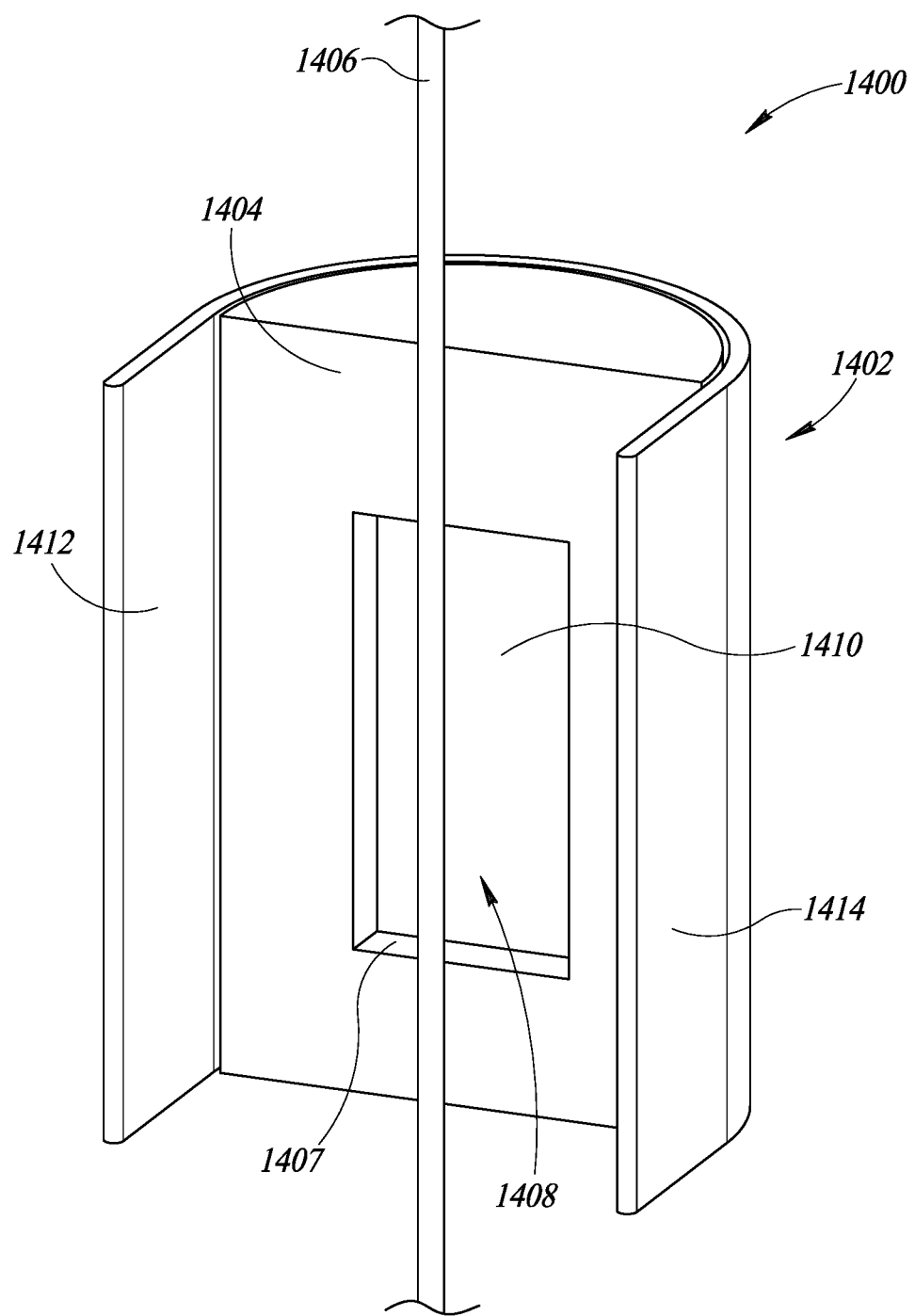
FIG. 15 is a perspective view of a portion of the sensor front end of FIG. 14A, with the guard ring clamp of the internal ground guard removed, according to one illustrated implementation.

FIGS. 14A and 14B show top views of a front end 1400 of a non-contact voltage measurement system, and FIG. 15 shows a perspective view of a portion of the front end. In this example, the front end 1400 includes an internal ground guard 1402 which includes front surface 1404 against which a wire 1406 (FIG. 15) under test may be positioned. The front surface 1404 includes an edge 1407, in this case rectangular-shaped, which defines an opening 1408 in the front surface. This small long rectangular opening accommodates the wire shape having also a longer but thin shape seen from the side. This again reduces adjacent wire influence. A conductive sensor 1410, which forms the coupling capacitor ($C_O$) with a wire under test, is recessed behind the opening 1408 of the front surface 1404 of the internal guard ground 1402 by a distance (e.g., 3 mm).

The internal ground guard 1402 also includes sidewalls 1412 and 1414 which extend forward (toward the wire under test) from lateral edges of the front surface 1404. The internal ground guard 1402 may also include a conductive guard ring clamp 1416 which includes a first clamp arm 1416A and a second clamp arm 1416B. The clamp arms 1416A and 1416B may be selectively moved into an opened position, shown in FIG. 14B, to allow a wire under test to be positioned adjacent the front surface 1404 of the internal ground guard 1402. Once the wire is in position, the clamp arms 1416A and 1416B may be selectively moved into a closed position, shown in FIG. 14A, to provide a shield around the sensor 1410 from capacitances with the external environment (e.g., adjacent conductors, adjacent objects). When in the closed position, the guard ring clamp 1416 may be substantially in the shape of a cylinder which has a height that extends above and below the sensor 1410, for example. The clamp arms 1416A and 1416B may be selectively movable using any suitable manual or automated actuation subsystem 1418. For example, the clamp arms 1416A and 1416B may be biased toward the closed position (FIG. 14A) by a spring or other biasing mechanism which functions as the actuation system 1418, which bias may be overcome by an operator to move the clamp arms into the opened position (FIG. 14B) so that a wire under test may be positioned proximate the front surface 1404 of the internal ground guard 1402.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a non-contact voltage measurement system may not utilize a processor to execute instructions. For example, a non-contact voltage measurement system may be hardwired to provide some or all of the functionality discussed herein. Additionally, in at least some implementations a non-contact voltage measurement system may not utilize a processor to cause or initiate the different measurements discussed herein. For example, such non-contact voltage measurement system may rely on one or more separate inputs, such as a user-actuated button which causes measurements to occur.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, all of the U.S. patents, U.S. patent application publications, U.S. patent applications, foreign patents, foreign patent applications and nonpatent publications referred to in this specification and/or listed in the Application Data Sheet, including but not limited to U.S. Provisional Patent Application No. 62/421,124, filed Nov. 11, 2016, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A system to measure alternating current (AC) voltage in an insulated conductor, the system comprising:
a housing;
a conductive sensor physically coupled to the housing, the conductive sensor selectively positionable proximate the insulated conductor without galvanically contacting the conductor, wherein the conductive sensor capacitively couples with the insulated conductor;
a conductive internal ground guard which at least partially surrounds the conductive sensor and is galvanically isolated from the conductive sensor, the internal ground guard sized and dimensioned to shield the conductive sensor from stray currents;
a conductive reference shield which surrounds at least a portion of the housing and is galvanically insulated from the internal ground guard, the conductive reference shield sized and dimensioned to reduce currents between the internal ground guard and an external ground;
a common mode reference voltage source which, in operation, generates an alternating current (AC) reference voltage having a reference frequency, the common mode reference voltage source electrically coupled between the internal ground guard and the conductive reference shield;
a current measurement subsystem electrically coupled to the conductive sensor, wherein the current measurement subsystem, in operation, generates a sensor current signal indicative of current conducted through the conductive sensor; and
at least one processor communicatively coupled to the current measurement subsystem, wherein, in operation, the at least one processor:
receives the sensor current signal from the current measurement subsystem; and
determines the AC voltage in the insulated conductor based at least in part on the received sensor current signal, the AC reference voltage and the reference frequency.

2. The system of claim 1 wherein, in operation, the current measurement subsystem receives an input current from the conductive sensor, and the sensor current signal comprises a voltage signal indicative of the input current received from the conductive sensor.

3. The system of claim 1 wherein the current measurement subsystem comprises an operational amplifier, which operates as a current-to-voltage converter.

4. The system of claim 1 wherein the at least one processor, in operation:
converts the received sensor current signal to a digital signal; and
processes the digital signal to obtain a frequency domain representation of the sensor current signal.

5. The system of claim 4 wherein the at least one processor implements a fast Fourier transform (FFT) to obtain the frequency domain representation of the sensor current signal.

6. The system of claim 5 wherein the common mode reference voltage source generates the AC reference voltage in phase with a window of the FFT implemented by the at least one processor.

7. The system of claim 1 wherein the at least one processor comprises at least one electronic filter which filters the received sensor current signal.

8. The system of claim 1 wherein the at least one processor processes the sensor current signal to determine an insulated conductor current component and a reference current component, the insulated conductor current component indicative of the current conducted through the conductive sensor due to the voltage in the insulated conductor, and the reference current component indicative of the current conducted through the conductive sensor due to the voltage of the common mode reference voltage source.

9. The system of claim 8 wherein the at least one processor determines the frequency of the determined insulated conductor current component of the sensor current signal.

10. The system of claim 9 wherein the at least one processor determines the AC voltage in the insulated conductor based on the insulated conductor current component, the reference current component, the frequency of the insulated conductor current component, the reference frequency and the AC reference voltage.

11. The system of claim 1 wherein the at least one processor processes the sensor current signal to determine the frequency of the voltage in the insulated conductor.

12. The system of claim 1 wherein the common mode reference voltage source comprises a digital-to-analog converter (DAC).

13. The system of claim 1 wherein the conductive reference shield at least partially surrounds the conductive internal ground guard.

14. The system of claim 1 wherein the conductive sensor and the conductive internal ground guard are each nonplanar in shape.

15. The system of claim 1 wherein at least a portion of the conductive reference shield is cylindrical in shape.

16. The system of claim 1 wherein the conductive internal ground guard includes a surface comprising a guard aperture, and the conductive sensor is recessed relative to the surface of the internal ground guard which comprises the guard aperture.

17. The system of claim 1 wherein the at least one processor obtains a first sensor current signal when the common mode reference voltage source is disabled, obtains a second sensor current signal when the common mode reference voltage source is enabled, and determines the AC voltage in the insulated conductor based at least in part on the first and second sensor current signals, the AC reference voltage and the reference frequency.

18. A method of operating a system to measure alternating current (AC) voltage in an insulated conductor, the system comprising a housing, a conductive sensor physically coupled to the housing which is selectively positionable proximate an insulated conductor without galvanically contacting the conductor, a conductive internal ground guard which at least partially surrounds the conductive sensor and is galvanically isolated from the conductive sensor, wherein the internal ground guard is sized and dimensioned to shield the conductive sensor from stray currents, a conductive reference shield which surrounds at least a portion of the housing and is galvanically insulated from the internal ground guard, wherein the conductive reference shield is sized and dimensioned to reduce currents between the internal ground guard and an external ground, the method comprising:
causing a common mode reference voltage source to generate an alternating current (AC) reference voltage having a reference frequency, the common mode reference voltage source electrically coupled between the internal ground guard and the conductive reference shield;

generating, via a current measurement subsystem electrically coupled to the conductive sensor, a sensor current signal indicative of current conducted through the conductive sensor;

receiving, by at least one processor, the sensor current signal from the current measurement subsystem; and determining, by at least one processor, the AC voltage in the insulated conductor based at least in part on the received sensor current signal, the AC reference voltage and the reference frequency.

19. The method of claim 18 wherein generating the sensor current signal comprises:

receiving an input current from the conductive sensor; and generating a voltage signal indicative of the input current received from the conductive sensor.

20. The method of claim 18 wherein the sensor current signal is generated utilizing an operational amplifier operating as a current-to-voltage converter.

21. The method of claim 18 wherein determining the AC voltage in the insulated conductor comprises:

converting, by at least one processor, the received sensor current signal to a digital signal; and processing, by at least one processor, the digital signal to obtain a frequency domain representation of the sensor current signal.

22. The method of claim 21 wherein processing the digital signal comprises implementing a fast Fourier transform (FFT) to obtain the frequency domain representation of the sensor current signal.

23. The method of claim 18 wherein determining the AC voltage in the insulated conductor comprises electronically filtering the received sensor current signal.

24. The method of claim 18 wherein determining the AC voltage in the insulated conductor comprises processing the sensor current signal to determine an insulated conductor current component and a reference current component, wherein the insulated conductor current component is indicative of the current conducted through the conductive sensor due to the voltage in the insulated conductor, and the reference current component is indicative of the current conducted through the conductive sensor due to the voltage of the common mode reference voltage source.

25. The method of claim 24 wherein determining the AC voltage in the insulated conductor comprises determining the frequency of the determined insulated conductor current component of the sensor current signal.

26. The method of claim 25 wherein the AC voltage in the insulated conductor is determined based on the insulated conductor current component, the reference current component, the frequency of the insulated conductor current component, the reference frequency and the AC reference voltage.

27. The method of claim 18 wherein determining the AC voltage in the insulated conductor comprises processing the sensor current signal to determine the frequency of the voltage in the insulated conductor.

28. The method of claim 18 wherein determining the AC voltage in the insulated conductor comprises:

obtaining, by at least one processor, a first sensor current signal when the common mode reference voltage source is disabled;

obtaining, by at least one processor, a second sensor current signal when the common mode reference voltage source is enabled; and determining, by at least one processor, the AC voltage in the insulated conductor based at least in part on the first and second sensor current signals, the AC reference voltage and the reference frequency.

29. A system to measure alternating current (AC) voltage in an insulated conductor, the system comprising:

a housing;

a conductive sensor physically coupled to the housing, the conductive sensor selectively positionable proximate the insulated conductor without galvanically contacting the conductor, wherein the conductive sensor capacitively couples with the insulated conductor;

a conductive internal ground guard which at least partially surrounds the conductive sensor and is galvanically isolated from the conductive sensor;

a conductive reference shield which surrounds at least a portion of the housing and is galvanically insulated from the internal ground guard;

a common mode reference voltage source which, in operation, generates an alternating current (AC) reference voltage having a reference frequency, the common mode reference voltage source electrically coupled between the internal ground guard and the conductive reference shield;

a measurement subsystem electrically coupled to the conductive sensor, wherein the measurement subsystem, in operation, detects current conducted through the conductive sensor; and at least one processor communicatively coupled to the measurement subsystem, wherein, in operation, the at least one processor:

receives a signal indicative of the detected current from the measurement subsystem; and determines the AC voltage in the insulated conductor based at least in part on the received signal, the AC reference voltage and the reference frequency.

* * * * *